United States Patent
Atmakuri et al.

(10) Patent No.: US 6,438,730 B1
(45) Date of Patent: Aug. 20, 2002

(54) RTL CODE OPTIMIZATION FOR RESOURCE SHARING STRUCTURES

(75) Inventors: Kiran Atmakuri; Juergen Lahner, both of Sunnyvale; Gopinath Kudva, Santa Clara, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/866,661

(22) Filed: May 30, 2001

(51) Int. Cl.[7] .............................................. G06F 17/50
(52) U.S. Cl. ................................. 716/1; 716/2; 716/18
(58) Field of Search ................................ 716/1, 2, 5, 8

(56) References Cited

U.S. PATENT DOCUMENTS

| | | | | |
|---|---|---|---|---|
| 5,537,330 A | * | 7/1996 | Damiano et al. | 716/18 |
| 6,226,777 B1 | * | 5/2001 | Zhang | 716/18 |
| 6,378,123 B1 | * | 4/2002 | Dupenloup | 716/2 |
| 6,389,379 B1 | * | 5/2002 | Lin et al. | 716/5 |

* cited by examiner

Primary Examiner—Trong Phan
(74) Attorney, Agent, or Firm—Fitch, Even, Tabin & Flannery

(57) ABSTRACT

A system and method of optimizing a circuit design. The design may be coded in register transfer language (RTL) code. First the design code representing an integrated circuit design to be optimized is retrieved and sequentially searched for decision constructs. As each decision construct is encountered, it is checked to determine whether both branches drive a common output in response to a common select signal. If so, a determination is made whether the decision construct includes a common arithmetic operation in said both branches, and so, may be optimized. A construct library for a corresponding optimized construct and the selected decision construct is replaced with an optimized construct. After all of the decision constructs are checked, the optimized design code is stored, replacing the original design code. The optimized RTL design code has an identical logic function to the original retrieved RTL code.

13 Claims, 5 Drawing Sheets

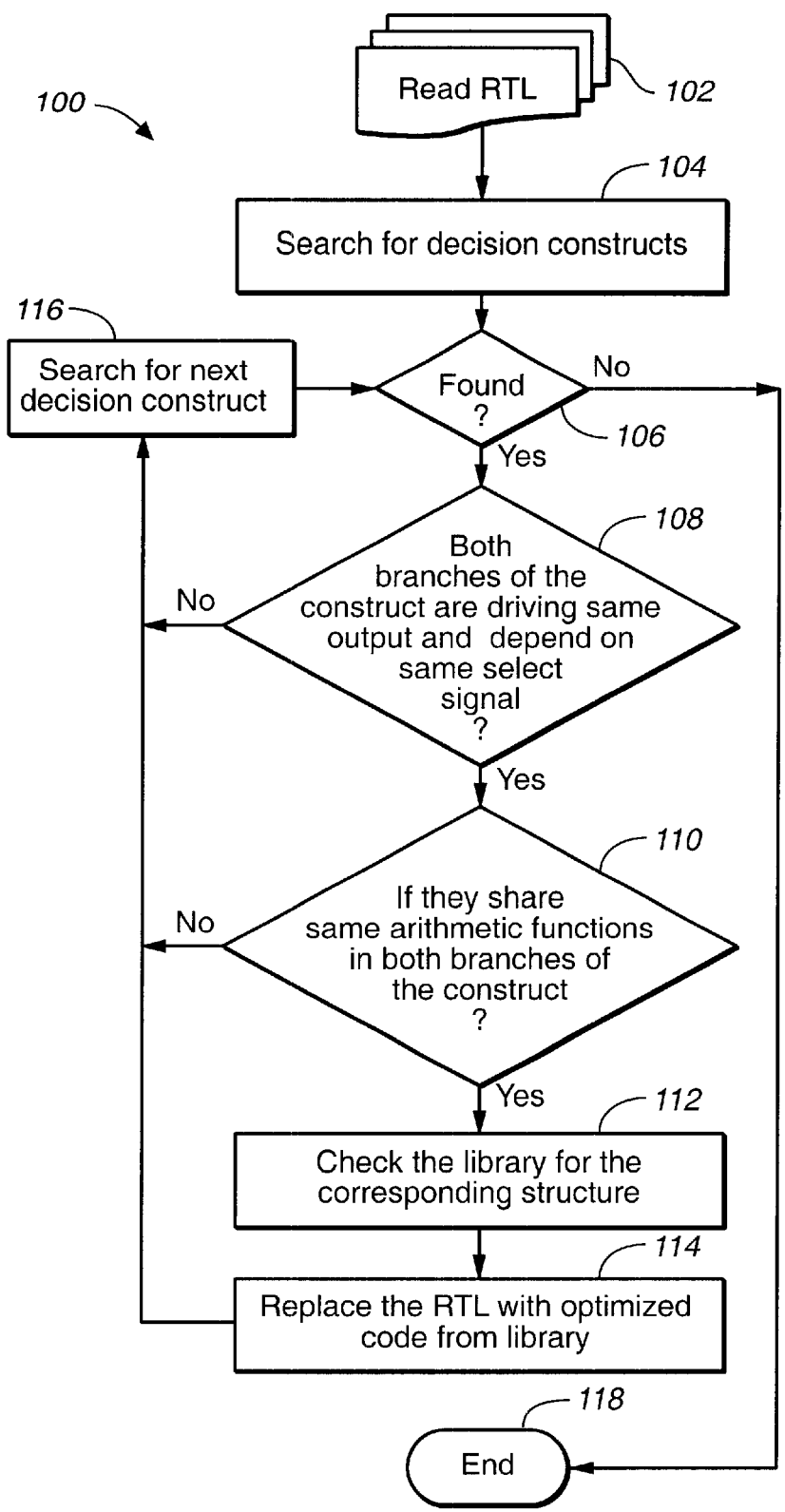
FIG._1

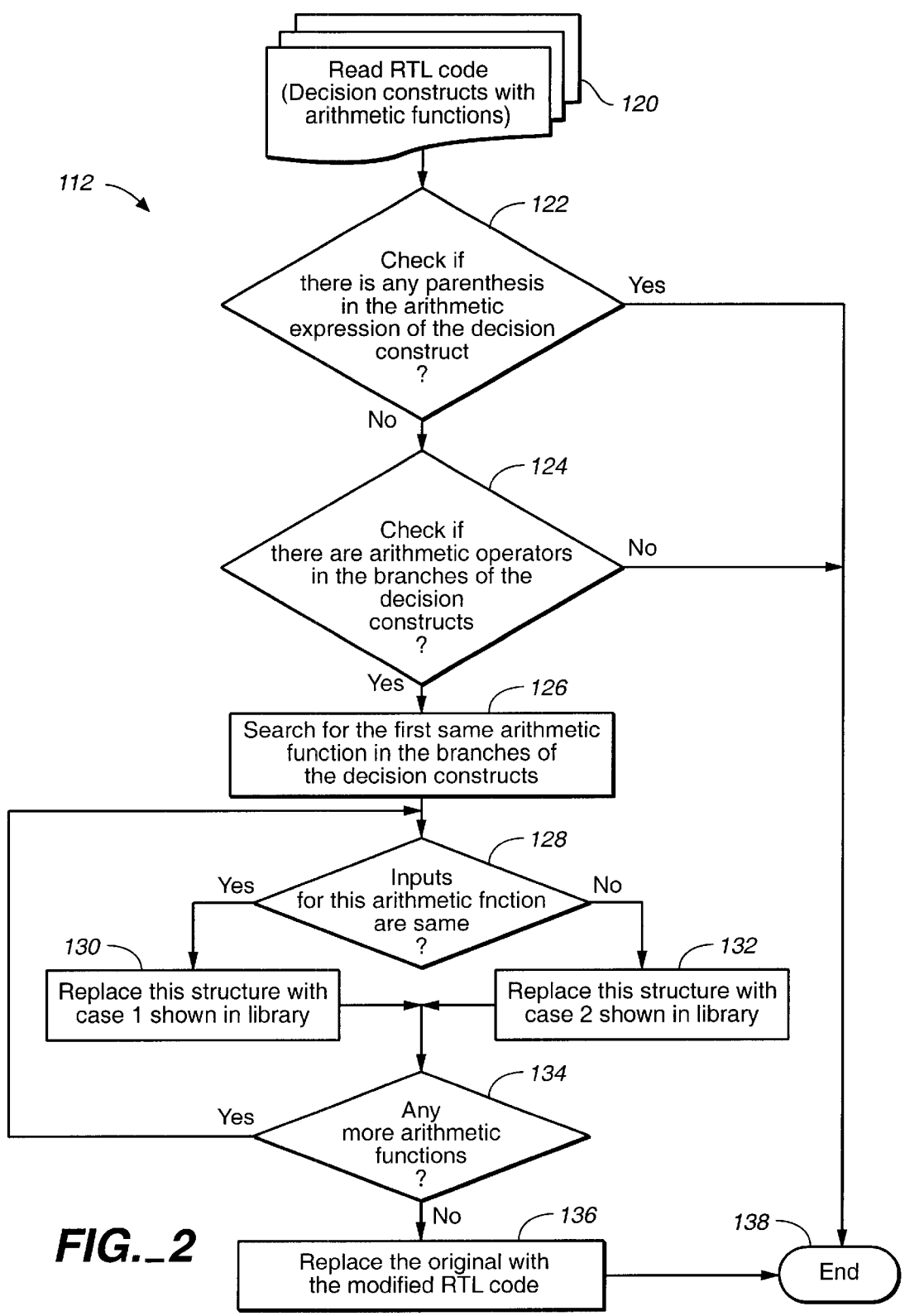
FIG._2

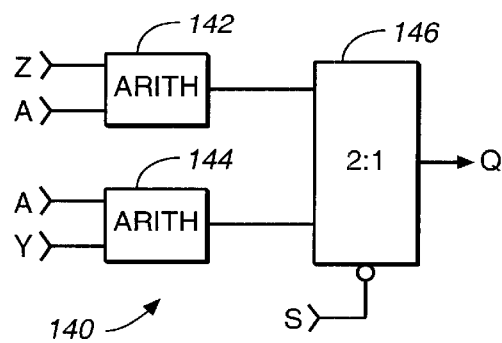
FIG._3A
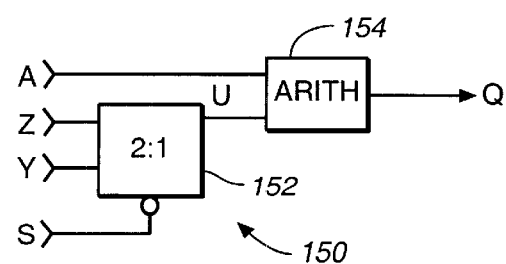
FIG._3B
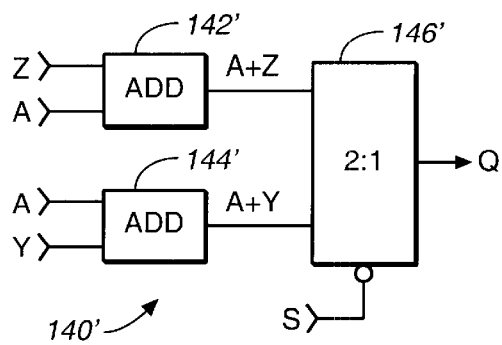
FIG._3C
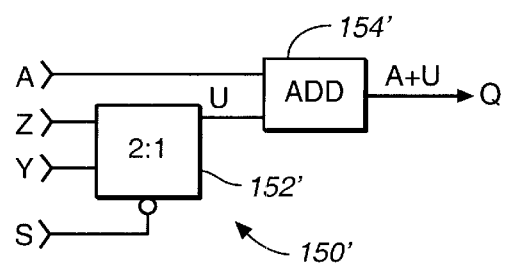
FIG._3D

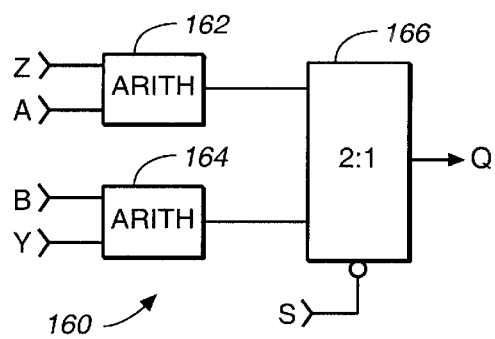
FIG._4A
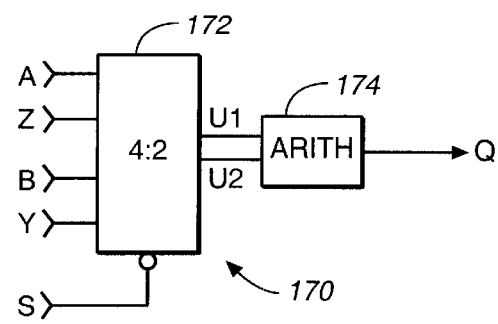
FIG._4B
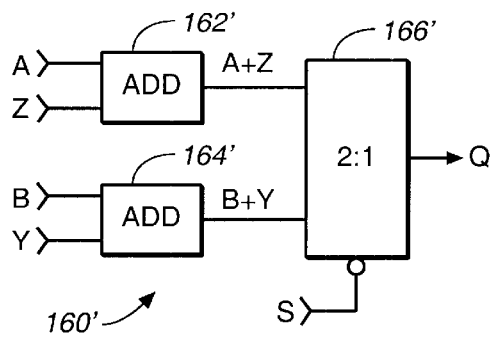
FIG._4C
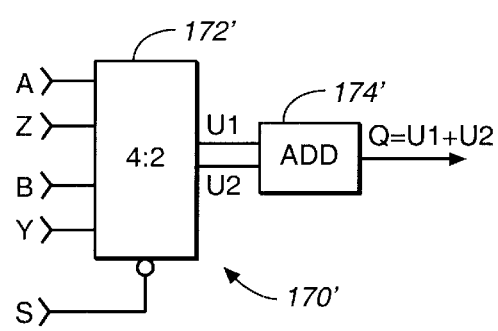
FIG._4D

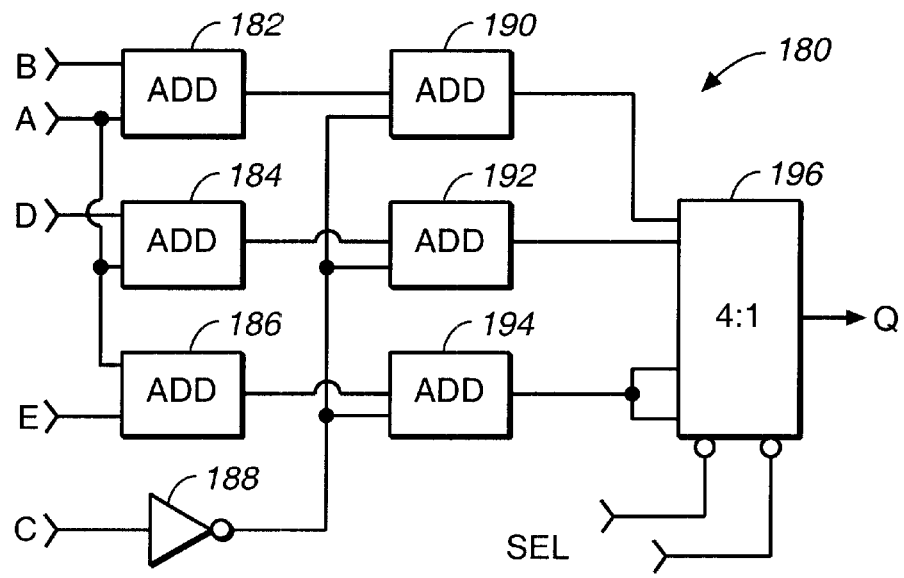
FIG._5A
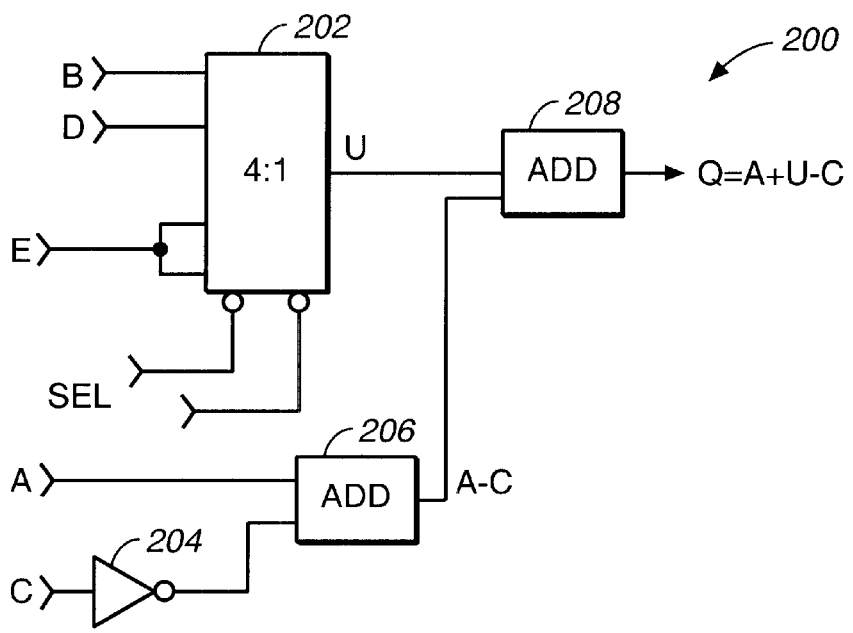
FIG._5B

RTL CODE OPTIMIZATION FOR RESOURCE SHARING STRUCTURES

BACKGROUND OF THE INVENTION

1. Field of the Invention

The present invention is related to design automation and more particularly to design automation tools for analyzing and optimizing integrated circuit designs.

2. Background Description

Register Transfer Language (RTL) coding plays an important role for any Application Specific Integrated Circuit/Field Programmable Logic Array (ASIC/FPGA) development. RTL coding influences the quality of device layout, design cycle time length, and design tool run time.

Typically, a designer tries to optimize the netlist results (e.g. timing or area) within the synthesis tools guided by tool dependant constraints. However, even when sophisticated synthesis strategies are used for optimization, the quality of the resulting netlist heavily depends on the quality of the RTL code (good RTL code in-good netlists out; garbage in-garbage out). Although the designer may optimize RTL code manually, besides providing individually varying results from designer to designer, such optimization is unacceptably time consuming and still error-prone. Consequently, focus mainly is directed to synthesis tools to optimize the resource sharing in a design. Unfortunately, inefficient RTL coded functions increase logic optimization time, and may still result in a less than optimal code or circuits, while simultaneously increasing design to silicon time turnaround (time) because both layout analysis and static timing analysis require additional time. Some designs may result serendipitously in silicon friendly code (producing optimum code for tool analysis and optimization) and others are not silicon friendly. However, optimizing an RTL coded design manually is very time consuming and requires training and discipline.

Thus, there is a need for RTL code optimization and, in particular for RTL code resource sharing optimization. Further, since RTL coding is a critical task for resource sharing, an automated approach is needed for such optimization.

SUMMARY OF THE INVENTION

The present invention is a system and method of optimizing a circuit design. The design may be coded in register transfer language (RTL) code. First the design code representing an integrated circuit design to be optimized is retrieved and sequentially searched for decision constructs. As each decision construct is encountered, it is checked to determine whether both branches drive a common output in response to a common select signal. If so, a determination is made whether the decision construct includes a common arithmetic operation in said both branches, and so, may be optimized. A construct library for a corresponding optimized construct and the selected decision construct is replaced with an optimized construct. After all of the decision constructs are checked, the optimized design code is stored, replacing the original design code. The optimized RTL design code has an identical logic function to the original retrieved RTL code.

BRIEF DESCRIPTION OF THE DRAWINGS

The foregoing and other objects, aspects and advantages will be better understood from the following detailed preferred embodiment description with reference to the drawings, in which:

FIG. 1 is a flow diagram of a method of automatic optimization of resource-sharing constructs according to the preferred embodiment of the present invention;

FIG. 2 is a flow diagram for the library check step wherein the library is checked for substitute optimum decision construct code;

FIGS. 3A–D are graphical representations of a first substitution structure corresponding to Table 1 and 2;

FIGS. 4A–D are representation of a second substitution structures corresponding to Tables 3 and 4; and FIGS. 5A–B are a more complex decision construct optimization example corresponding to the RTL code of Table 5.

DESCRIPTION OF PREFERRED EMBODIMENTS

The present invention is a system and method of automatic RTL code optimization which may be practiced on a general purpose computer, a scientific workstation computer, a suitably equipped personal computer or the like. Variability in circuits, macros, etc., resulting from numerous different ways of coding the same functionality using, for example, register transfer language (RTL) code is removed automatically. Uneven results that otherwise may depend on RTL coding style, the synthesis tools employed, or even the version of the synthesis tool used is avoided by focusing analysis on RTL coding style.

So as can be seen from the drawings and more particularly, FIG. 1 is a flow diagram of an automatic optimization method for optimizing resource-sharing constructs 100 according to the preferred embodiment of the present invention, wherein a circuit, macro or logic function is coded as RTL code, checked for mutually exclusive branch decision constructs, e.g., case, if-else, if-else-if, etc. If any constructs include branches that simultaneously depend on same select signal, drive the same output and share the same arithmetic function, then those constructs can be replaced with more efficient equivalents, if any, to optimize the RTL code.

So, in step 102 the RTL code for the particular function, integrated circuit (IC), macro, etc., is read. Then, in step 104 the RTL code is searched sequentially for decision constructs until a decision construct is encountered in step 106. Then, in step 108 that decision construct is checked to determine whether both construct branches are driving the same output and, whether they depend on the same select signal. If so, then continuing to step 110, the branches are checked to determine whether or not they share the same arithmetic functions such that optimization may be applied to the construct according to the present invention. If so, in step 112 the library is checked for a corresponding optimum structure, as described in more detail hereinbelow. Then, in step 114 the construct is replaced with the optimum construct. It should be noted that this replacement step 114 may not result in a decision construct change if the original decision construct is of the same form as the optimal decisional construct. In step 116 the RTL code is searched for a next decision construct and, when one is found returning to in step 106 that next construct is interrogated to determine if it can be optimized beginning in step 108. In step 108 if a determination is made that the decision construct branches are driving different outputs or, are controlled by different select signals, then that decision construct cannot be optimized and, immediately returning to step 116, the RTL code is searched for the next decision construct. Likewise, in step 110 if the branches include different arithmetic functions, then the RTL code is searched for the next decision construct in step 116. After the last decision construct is interrogated, no additional constructs are found in step 106 and, in step 118 optimization ends.

FIG. 2 is a flow diagram for the library check step 112 wherein the library is checked for substitute optimum decision construct code. First in step 120 the RTL code for the decision construct is read. Then, in step 122 the decision construct is checked to determine if it includes an arithmetic expression with any parenthetical elements. If not, then in step 124 the decision construct branches are checked for any arithmetic operators. If arithmetic operators are found, then in step 126, the first common occurrence of any arithmetic operator in all of the branches is identified. In step 128 inputs for the common arithmetic operation are checked to determine if they are the same. If they are found to be the same, then, in step 130 the arithmetic operation is replaced with a first optimized representation as described in more detail hereinbelow. Otherwise, in step 132 the structure is replaced with a second representation as described in more detail hereinbelow. In step 134 the decision construct branches are checked to determine if any additional common arithmetic functions occur in all branches and, if so, returning to step 128 the additional common arithmetic functions are optimized. Otherwise, if no additional common arithmetic functions are found in step 134, then, in step 136 the optimized decision construct is substituted into the RTL code. In step 138 processing the construct in the library ends by returning to step 114. Further, in step 122 if parenthetical elements are found in the decision construct, then reorganization for optimization is not indicated and the library step is complete. Also, if in step 124 common arithmetic operators are not found in the branches, then the library function is also complete and RTL code processing continues in step 114.

TABLE 1

| In 140 | Out 150 |
|---|---|
| decision construct | decision construct |
|   Branch 1 |   Branch 1 |
|     Out=A (arithmetic operator) Z; |     U=Z; |
|   Branch 2 |   Branch 2 |
|     Out=A (arithmetic operator) Y; |     U=Y; |
|   . |   . |
|   . |   . |
|   . |   Out=A(arithmetic operator) U; |
|   (more branches are possible) | |

FIGS. 3A–D are graphical representations of the first substitution structure of step 128 and corresponding to Tables 1 and 2. Thus, for the first type substitution in Table 1, the original decision construct 140 in FIG. 3A has at least two branches 142, 144 performing arithmetic operations on a common input, A, which is operated on arithmetically with two different inputs (Y,Z) to produce an output, Q, from a common block 146 as selected by a common select S. FIG. 3B shows the corresponding optimized construct 150. The two individual branch inputs, Z and Y, are provided to decision block 152, which passes either Z or Y in response to S. The output, U, from block 152 is passed to arithmetic operator block 154. Arithmetic operator block 154 operates arithmetically on inputs, A and U, to provide Q. Q is identical for equivalent constructs 150 and 140.

TABLE 2

| In 140' | Out 150' |
|---|---|
| if(s=0) | if(s=0) |
|   Out=A+Y; |   U=Y; |
| else | else |
|   Out=A+Z |   U=Z; |
| | Out=A+U; |

FIGS. 3C and 3D are a graphical representation of a specific example of Table 2 of this first substitution structure of step 128. In FIG. 3C arithmetic operator blocks 142' and 144' are both adders. The sum from each adder 142', 144' is provided to 2 to 1 multiplexer 146' which passes the result as Q. FIG. 3D is the corresponding optimized construct 150'. Block 152' is a two to one multiplexor. Output U is Z or Y as selected by S. Adder 154' adds U to A and the output Q is A plus U. The results of 140' and 150' are identical.

TABLE 3

| In 160 | Out 170 |
|---|---|
| decision construct | decision construct |
|   Branch 1 |   Branch 1 |
|     Out=A(arithmetic operator)Z; |     U1=A; |
|   Branch 2 |     U2=Z |
|     Out=B(arithmetic operator)Y; |   Branch 2 |
|   . |     U1=B; |
|   . |     U2=Y; |
|   . |   . |
|   (more branches are possible) |   . |
| |   . |
| | Out=U1(arithmetic operator)U2; |

FIGS. 4A–D are representation of the substitution structures for step 130 and corresponding to Tables 3 and 4. In this example as represented in Table 3 and RTL construct 160, inputs A and Z to arithmetic operator blocks 162 are different from inputs B and Y to arithmetic operator block 164. Select block 166 selects the result from either arithmetic block 162 or 164 in response to select control S. The output of the construct 160 is the output of select block 166. FIG. 4B shows the corresponding optimized construct 170. In this construct 170 all four inputs are provided to input block 172. Two outputs, U1 and U2, either A and Z or B and Y, are provided in response to select control S. U1 and U2 are combined in arithmetic operator 174. Result outputs from blocks 166 and 174 are identical.

TABLE 4

| In 160' | Out 170' |
|---|---|
| if(s=0) | if(s=0) |
|   Out=A+Y; |   U1=A; |
| else |   U2=Y; |
|   Out=B+Z | else |
| |   U1=B; |
| |   U2=Z; |
| | Out = U1+U2; |

Thus, for the specific example of Table 4 in FIG. 4C adder 162' adds A and Z to provide A plus Z and adder 164' adds B and Y to provide B plus Y. A two to one multiplexer 166' selects either sum in response to select signal S providing the selected sum on the output Q. FIG. 4D shows an example of a corresponding optimized construct 170'. All four input signals A, Z and B, Y are provided to four to two (4:2) multiplexer 172'. Select signal S passes one pair of inputs to outputs U1 and U2, i.e., A, Z or B, Y. Those two outputs U1 and U2 are added in adder 174' and the sum of U1 and U2 is provided at the output Q. Again, the outputs from these two constructs 160' and 170' are identical.

TABLE 5

| In 180 | Out 200 |
|---|---|
| case(sel) | case (sel) |
| 00:Out=A+B−C; | 00:U1=B; |
| 01:Out=A+D−C; | 01:U1=D; |
| default:Out=A+E−C; | default:U1=E; |
| end case | end case |
|  | Out=A+U1−C; |

FIGS. 5A–B show a somewhat more complex example of decision construct optimized according to the present invention corresponding to the RTL code of Table 5. Thus, in FIG. 5A the construct includes arithmetic blocks (adders) 182, 184, 186 each combining common input A with an individual input B, D and E. Further, input C is inverted in an inverter 188 and the result of the inverter is combined with the sums from adders 182, 184 and 186 in adders 190, 192 and 194 thereby subtracting C from the sums of the previous adders. The final value is passed to a four to one multiplexer 196 and, depending on the select inputs, one of the results is passed out as output Q. Input A has a fan in of three (3) and inverter 188 has an internal fan out of 3.

FIG. 5B is corresponding optimized construct 200 for the construct of 180 of FIG. 5A. Individual inputs B, D and E are provided to four to one mux 202 and one input is selected by select inputs and provided as output U. Common input C is inverted in an inverter 204 and combined in adder 206 with common input A to provide difference, A minus C. The difference is added with U in adder 208 to provide the sum A plus U minus C. The output of block 208 is identical to the output of block 196. Inputs A–D have a fan in of 1 and input E has a fan in of 2.

Thus, the logic of block two 180 has been optimized using the construct of 200 according to the present invention.

It should be noted that although the arithmetic operator is described above for addition and selection, this is intended for example only. It is understood that any simple or complex arithmetic operator can be substituted such as subtraction, multiplication, division, etc., as appropriate.

Thus, the present invention provides silicon friendly results i.e. less area and better cycle time. RTL code is optimized to reduce gate area routing congestion, and power consumption with improved timing results.

While the invention has been described in terms of preferred embodiments, those skilled in the art will recognize that the invention can be practiced with modification within the spirit and scope of the appended claims.

We claim:

1. A method of optimizing a circuit design comprising the steps of:
   a) retrieving design code representing an integrated circuit design to be optimized;
   b) sequentially searching said retrieved design code for decision constructs;
   c) replacing selected encountered decision constructs with a previously identified corresponding optimum construct; and
   d) storing said design code, optimum constructs having replaced selected decision constructs, stored design code being optimized design code, said optimized design code having an identical logic function to said retrieved code.

2. A method as in claim 1 wherein the step (c) of replacing selected decision constructs with identified corresponding optimum constructs comprises the steps of:
   i) determining whether both branches of said selected decision construct drive a common output responsive to a common select signal;
   ii) determining whether said decision construct includes a common arithmetic operation in said both branches;
   iii) checking a construct library for a corresponding optimized construct;
   iv) replacing said selected decision construct with an optimized construct from said construct library; and
   (v) returning to step (b) and sequentially searching for a next decision construct until a last decision construct is encountered.

3. A method as in claim 2 wherein if in step (i) if said both branches are found to be driving different outputs, steps (ii)–(iv) are skipped.

4. A method as in claim 2 wherein if in step (i) if said both branches are being driven responsive to different select signals, steps (ii)–(iv) are skipped.

5. A method as in claim 2 wherein if in step (ii) if a common arithmetic operation is not found in both branches, steps (iii) and (iv) are skipped.

6. A method of circuit design as in claim 2 wherein the step (iii) of checking for a corresponding optimized construct comprises the steps of:
   A) checking if the common arithmetic operation in the decision construct contains any parentheses;
   B) checking for arithmetic operators in decision construct branches; and
   C) selecting an optimum structure, said decision construct being replaced with said selected optimum structure.

7. A method as in claim 6 wherein if in step (A) parentheses are found steps (B)–(C) and (iv) are skipped.

8. A method as in claim 7, wherein if in step (B) arithmetic operators are not found in said construct branches, steps (C) and (iv) are skipped.

9. A method as in claim 6 wherein the step C) of selecting the optimum structure comprises the steps of:
   I) checking arithmetic functions for common inputs;
   II) replacing arithmetic functions having at least one common input with a first structure; and
   III) replacing remaining said arithmetic functions with a second basic structure.

10. A circuit design system for optimizing a circuit design, said system comprising:
    means for receiving design code representative of a design to be optimized;
    means for identifying decision constructs in said design code;
    means for storing a library of optimum decision constructs;
    means for selectively replacing a decision construct with a corresponding optimum decision construct from said library; and
    means for storing optimized said design code.

11. A system as in claim 10 wherein the means for selectively replacing decision constructs comprises:
    means for determining whether both branches of a selected decision construct drive a common output responsive to a common select signal and include a common arithmetic operation;

means for checking said library for a corresponding optimized construct; and means for replacing said selected decision construct with an optimized construct from said construct library.

12. A system as in claim 11 wherein the means for checking for a corresponding optimized construct comprises:

means checking for parentheses in an identified common arithmetic operation, parentheses indicating an optimized construct is not included in said library;

means for identifying arithmetic operators in decision construct branches, common arithmetic operators indicating an optimized construct is included in said library; and means for selecting an optimum structure from said library, said decision construct being replaced with said selected optimum structure.

13. A system as in claim 12 wherein the means for selecting the optimum structure comprises:

means for replacing identical arithmetic functions having at least one common input with a first optimum structure; and means for replacing identical arithmetic functions having unique inputs with a second optimum structure.

* * * * *